United States Patent
Jiang et al.

(10) Patent No.: US 6,979,598 B2
(45) Date of Patent: *Dec. 27, 2005

(54) METHOD OF ATTACHING A LEADFRAME TO SINGULATED SEMICONDUCTOR DICE

(75) Inventors: Tongbi Jiang, Boise, ID (US); Syed S. Ahmad, Boise, ID (US); Walter L. Moden, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/799,948

(22) Filed: Mar. 12, 2004

(65) Prior Publication Data

US 2004/0175863 A1 Sep. 9, 2004

Related U.S. Application Data

(63) Continuation of application No. 10/231,727, filed on Aug. 28, 2002, now Pat. No. 6,706,559, which is a continuation of application No. 09/938,105, filed on Aug. 23, 2001, now Pat. No. 6,506,628, which is a continuation of application No. 09/651,461, filed on Aug. 30, 2000, now Pat. No. 6,312,977, which is a continuation of application No. 09/433,440, filed on Nov. 4, 1999, now Pat. No. 6,200,833, which is a continuation of application No. 08/840,403, filed on Apr. 29, 1997, now Pat. No. 6,017,776.

(51) Int. Cl.[7] ............................................. H01L 21/44
(52) U.S. Cl. ......................................................... 438/118
(58) Field of Search ............................ 438/14, 15, 111, 438/113, 118, 119, 123

(56) References Cited

U.S. PATENT DOCUMENTS

| | | |
|---|---|---|
| 4,862,245 A | 8/1989 | Pashby et al. |
| 5,139,973 A | 8/1992 | Nagy et al. |
| 5,208,188 A | 5/1993 | Newman |
| 5,221,642 A | 6/1993 | Burns |
| 5,286,679 A | 2/1994 | Farnworth et al. |
| 5,304,842 A | 4/1994 | Farnworth et al. |
| 5,579,573 A | 12/1996 | Baker et al. |
| 5,681,757 A | 10/1997 | Hayes |
| 5,683,944 A | 11/1997 | Joiner et al. |
| 5,776,799 A | 7/1998 | Song et al. |
| 5,840,598 A | 11/1998 | Grigg et al. |
| 5,851,845 A | 12/1998 | Wood et al. |
| 5,943,557 A | 8/1999 | Moden |
| 5,960,258 A | 9/1999 | Moden |
| 6,017,776 A | 1/2000 | Jiang et al. |
| 6,200,833 B1 | 3/2001 | Jiang et al. |
| 6,312,977 B1 | 11/2001 | Jiang et al. |
| 6,506,628 B2 | 1/2003 | Jiang et al. |

*Primary Examiner*—David S. Blum
(74) *Attorney, Agent, or Firm*—TrazkBritt

(57) ABSTRACT

The present invention is directed to a method of attaching a leadframe to a singulated good die using a wet film adhesive applied in a predetermined pattern on the active surface of the good die, the lead finger of a leadframe, or both. By applying the adhesive only to identified good dice, time and material are saved over a process that applies adhesive to the entire wafer. By attaching the leadframe to the good die with a wet film, it is possible to remove the leadframe from the good die for rework if the good die subsequently tests unacceptable.

68 Claims, 2 Drawing Sheets

METHOD OF ATTACHING A LEADFRAME TO SINGULATED SEMICONDUCTOR DICE

CROSS-REFERENCE TO RELATED APPLICATIONS

This application is a continuation of application Ser. No. 10/231,727, filed Aug. 28, 2002, now U.S. Pat. No. 6,706,559, issued Mar. 16, 2004, which is a continuation of application Ser. No. 09/938,105, filed Aug. 23, 2001, now U.S. Pat. No. 6,506,628, issued Jan. 14, 2003, which is a continuation of application Ser. No. 09/651,461, filed Aug. 30, 2000, now U.S. Pat. No. 6,312,977, issued Nov. 6, 2001, which is a continuation of application Ser. No. 09/433,440, filed Nov. 4, 1999, now U.S. Pat. No. 6,200,833, issued Mar. 13, 2001, which is a continuation of application Ser. No. 08/840,403, filed Apr. 29, 1997, now U.S. Pat. No. 6,017,776, issued Jan. 25, 2000.

BACKGROUND OF THE INVENTION

1. Field of the Invention

The present invention relates to semiconductor device packaging. More particularly, the present invention relates to a method for attaching a singulated good die, determined to be a good die by the probe testing thereof while in wafer form, not to be confused with known-good-die (KGD), which is a die known to be good after the burn-in and testing thereof, to a leadframe by applying a liquid or paste mixture of unreacted monomers or polymers or a diluted resin deposited in a predetermined pattern on the active surface of the semiconductor device, the leadframe, or both, after the die has been separated from the wafer and probe tested.

2. State of the Art

Well known types of semiconductor devices are connected to components, typically a leadframe, and subsequently encapsulated in thermo-setting plastic materials for use in a wide variety of applications. A conventional type leadframe is typically formed from a single, continuous sheet of metal, typically using metal stamping operations. The leadframe includes an outer supporting frame, a central semiconductor device supporting pad (die paddle) and a plurality of lead fingers, each lead finger having, in turn, a terminal bonding portion near the die paddle on which the semiconductor device is located. Ultimately, the outer supporting frame portions of the leadframe are removed after wire bonds are connected between the contact pads of the semiconductor device and the lead fingers of the leadframe and the encapsulation of the semiconductor device and portions of the lead fingers.

In the assembly of semiconductor devices utilizing such leadframes, a semiconductor device is secured to the die paddle (such as by a solder or epoxy die-attach material, although a double-sided adhesive tape has also been suggested in the art) and then the entire leadframe, with the semiconductor device thereon, is placed into a wire bonding apparatus, including a clamp assembly for holding the leadframe and semiconductor device assembly, and clamping the lead fingers for bonding.

In a standard wire bonding process, the bond wires are attached, one at a time, from each bond pad on the semiconductor device to a lead finger. The bond wires are generally attached through one of three industry-standard wire bonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts.

U.S. Pat. No. 4,862,245, issued Aug. 29, 1989, to Pashby et al., illustrates a so-called "leads over chip" arrangement ("LOC") on the semiconductor die. A plurality of lead fingers extend over the active surface of a semiconductor device toward a line of bond pads wherein bond wires make the electrical connection between the lead fingers and the bond pads. An alpha barrier, such as a polyimide (for example, Kapton™) tape, is adhered between the semiconductor die and the lead fingers. This configuration, which eliminates the use of the previously-referenced central die attach pad (die paddle), may assist in limiting the ingress of corrosive environment contaminants, achieve a larger portion of the lead finger path length encapsulated in the packaging material, and reduce electrical resistance caused by the bond wires (i.e. the longer the bond wire, the higher the resistance) and potential wire sweep problems aggravated by long wire loops. Clearly, such is in contrast to a conventional leadframe and semiconductor die wherein a larger semiconductor die cannot be encapsulated to form a smaller package assembly, as the overall size of the conventional leadframe having lead fingers extending adjacent the semiconductor device governs the size of the encapsulated package.

The typical method for attaching the die to the lead fingers in a LOC configuration is to use an adhesive tape having a thermoplastic adhesive on both sides. The face of the die and the lead fingers are attached to the adhesive tape using heat and pressure. This process is expensive and complicated. The tape must be precisely attached to the lead fingers and die face so that the bond pads on the die face are not covered by the adhesive tape. In addition, different sizes of tapes and different tape punches must be used for each die size.

U.S. Pat. No. 5,286,679, issued Feb. 15, 1994, to Farnworth et al., and assigned to the assignee of the present invention illustrates a method for attaching a die to a leadframe comprising the steps of: forming an adhesive layer on a semiconductor wafer; patterning the adhesive layer to clear streets for saw cutting and to clear wire bond pads; separating the dice from the wafer; heating the adhesive layer; and attaching the lead fingers by pressing the lead fingers and die together. In an alternative embodiment, the adhesive layer is applied to the lead fingers of the leadframe rather than to the wafer. The adhesive used is either a thermoplastic adhesive, such as a polyimide, or a thermoset adhesive, such as a phenolic resin. Suggested methods for depositing and patterning the adhesive are: hot screen printing, cold screen printing, resist etch back, and photo-patterning. One problem with such a method is that the adhesive layer is applied and patterned to all dice on a wafer prior to sawing. It is not unusual for the yield rate in die production to be low. Therefore, adhesive is applied to many dice that are already known to be defective after the probe testing thereof or that will be subsequently rejected after singulation due to a failure to meet acceptable performance criteria. This results in material waste and decreased efficiency. Alternately, the '679 patent discloses the application and patterning of adhesive after the dice have been singulated. However, such requires the adhesive to be applied and subsequently patterned, rather than adhesive applied in a predetermined pattern to the singulated die in a single step.

In addition, it is difficult to rework or fix a die after the lead fingers have been attached to the die face if a thermoplastic or thermoset adhesive has been used. If a thermoset adhesive was used, the lead fingers are permanently attached to the die face. If a thermoplastic adhesive was used, it is necessary to reheat the die and leadframe at a substantially elevated temperature. Alternately, the adhesive has been applied to the lead fingers of the leadframes which have been subsequently bonded to the active surface of the semiconductor device before testing of the semiconductor device has been completed, thereby making it difficult or impossible to rework the semiconductor device if found to be defective during testing.

Thus, it would be advantageous to develop a process for packaging semiconductor devices that would reduce process steps and reduce material waste.

BRIEF SUMMARY OF THE INVENTION

The present invention relates to a method for attaching a singulated semiconductor die or batches of singulated semiconductor dice to a leadframe by applying a liquid or paste mixture of unreacted monomers or polymers or a diluted resin deposited in a predetermined pattern on the die face, the leadframe, or both, after the semiconductor die has been separated from the wafer and tested sufficiently before or after separation to be referred to as a good die.

The method of the present invention comprises the steps of separating individual dice from a wafer; testing the dice or, optionally, separating dice probe tested and found to be acceptable; applying adhesive in a predetermined pattern to the good die or expected to be good dice from the testing thereof; and attaching the leadframe to the dice, either a die singly or in batches of singulated dice. An intermediate curing step may be used prior to attaching the leadframe to the dice. A post cure step may also be used after the leadframe has been attached to the dice. The adhesive is applied in a predetermined pattern to the die face or the lead fingers of the leadframe or both. In addition, the adhesive is applied as a wet film. Therefore, it is possible to remove the leadframe from the die for reworking if the die is subsequently determined to be bad. Because the adhesive is applied only to good dice determined from the testing thereof, time and material are saved as opposed to a process that applies adhesive to all dice in a wafer or to singulated dice wherein the adhesive is first applied to the dice and patterned thereafter.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
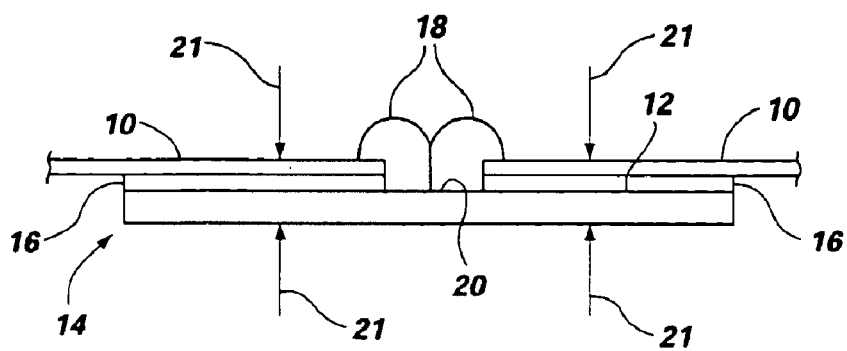
FIG. 1 is a side view of a semiconductor device which illustrates a semiconductor device produced with the method of the present invention.
Figure 2:
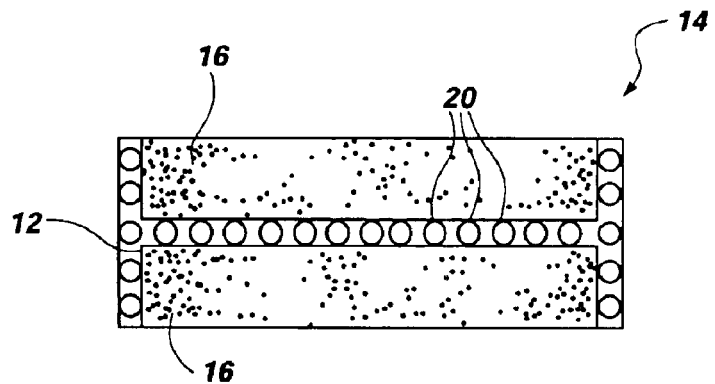
FIG. 2 is a top view of a semiconductor die coated with an adhesive layer in accordance with the method of the present invention.
Figure 3:
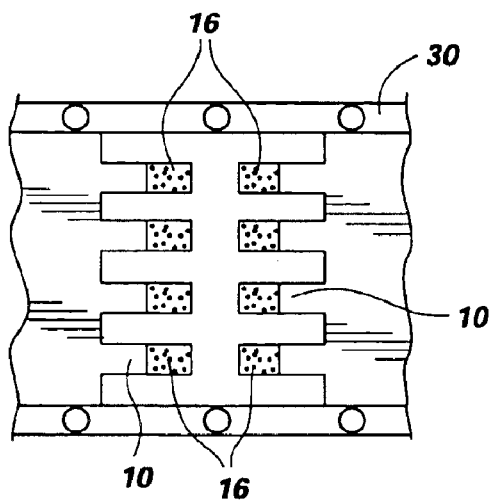
FIG. 3 is a bottom view of a leadframe with the lead fingers coated with an adhesive layer in accordance with the method of the present invention.

As illustrated in drawing FIGS. 1 through 3, the lead fingers 10 of a leadframe 30 have been secured to the active surface 12 of semiconductor device 14 using a wet film adhesive 16 in accordance with the method of the present invention. The leadframe 30 is electrically connected to the semiconductor device (or good die) 14 by lead wires 18 (wire bonds) which connect the bond pads 20 on the active surface 12 of the semiconductor device 14 to the lead fingers 10 of the leadframe 30.

Generally speaking, the method of the present invention involves the following steps:

1. Identifying individual dice known to be good or acceptable for the intended usage thereof while still in wafer form.
2. Separating identified good dice individually from the wafer.
3. Further identifying the individual dice that meet acceptable performance criteria (good die), if necessary, to the extent necessary to identify the individual dice.
4. Applying an adhesive in a predetermined pattern to the active surface of the identified good die, the lead fingers of the leadframe, or both.
5. Attaching the lead fingers of the leadframe to the active surface of the identified good die.

After the dice have been removed from the wafer, the next step is to identify the individual dice that meet acceptable performance criteria (good die). Identifying good dice involves using any of the well-known testing methods. Preferably, the dice are initially tested when in wafer form using well-known probe testing techniques in the industry. The dice are removed from the wafer after such probe testing, being subsequently tested individually, if desired, or if probe testing cannot determine all the desired information from the dice, because of the ease of testing an individual die as opposed to the difficulty of probe testing the dice of an entire wafer. After testing a die, it is either moved on for further processing if it is good, or discarded or sent for reworking if it is bad. In this manner, valuable process time, adhesives, insulation tape, leadframes, and encapsulation material are not wasted on dice that are bad.

Figure 4:
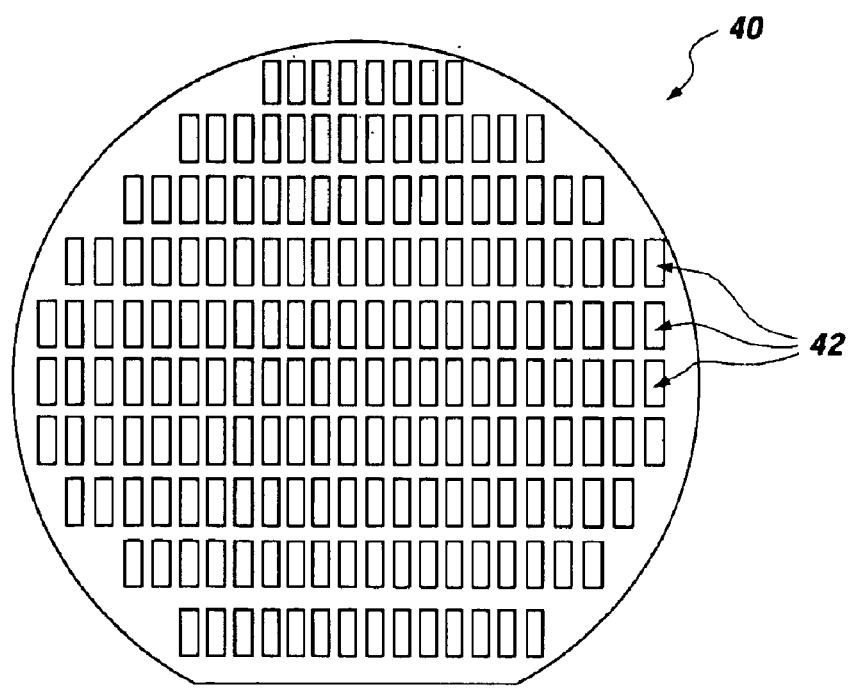
FIG. 4 is a top view of a semiconductor wafer.
Figure 5:
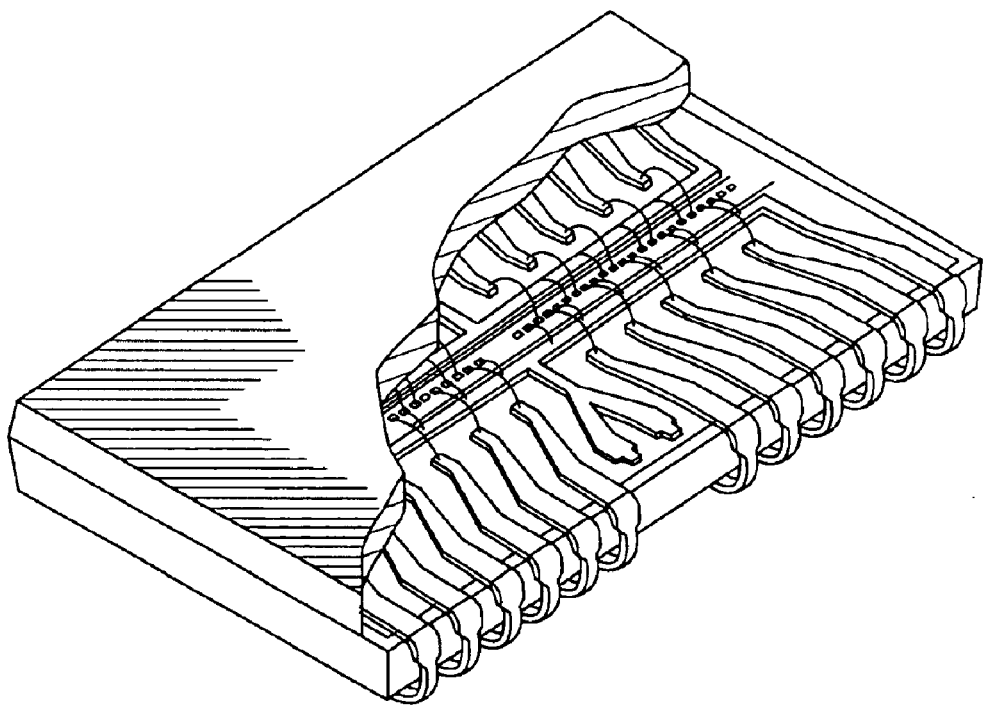
FIG. 5 is a perspective view, partially broken away, of a conventional packaged semiconductor device using a LOC type configuration.

In the first step of the method of the present invention, a semiconductor wafer is diced to separate or remove individual dice from the wafer, the wafer typically being diced by sawing. As illustrated in drawing FIG. 2, a semiconductor device (good die) 14 has been removed from a semiconductor wafer. The semiconductor wafer 40, as shown in drawing FIG. 4, contains a plurality of semiconductor devices (dice) 42. Frequently, yield rates in semiconductor device production are quite low because defects in the individual die hinder the ability of a die to reach acceptable performance standards set by the customer while the die may be capable of meeting some performance standards. Processing the dice while in the wafer state results in a tremendous waste of time and material because many of the dice may be subsequently rejected due to failure to meet acceptable performance criteria.

After the dice have been tested and the good dice have been identified, the good dice are then placed in a fixture, either singularly or in groups, for processing. The good dice are aligned in the fixture to match the dice sites of the leadframe to which they will be attached and connected.

The next step of the present invention involves applying an adhesive 16 in a predetermined pattern on the active surface 12 of a good die 14. Alternately, the adhesive may be applied in a predetermined pattern to the lead fingers 10 of a leadframe 30, or both, to the active surface 12 of a good die 14 and the lead fingers 10 of a leadframe 30. As illustrated in drawing FIG. 2, the active surface 12 of a good die 14 is selectively coated with the adhesive 16 in a predetermined pattern using any well-known technique, such as screen printing, roll-on, spray-on, stencil, etc. In screen printing, the adhesive is applied with a squeegee through a fine screen mesh that is coated in various areas to define the desired application pattern. In a roll-on technique, the adhesive is transferred to a soft, grooved roller and then onto the surface. In spray-on applications, the adhesive is sprayed onto the surface in the desired pattern using a spray gun. A stencil may be used to obtain the desired pattern or non-application areas may be masked to prevent application of the adhesive.

Alternatively, as illustrated in drawing FIG. 3, the adhesive 16 may be applied to the lead fingers 10 of the leadframe 30. The adhesive 16 is applied in a predetermined pattern such that the bond pads 20 and other desired areas are free from adhesive 16, as shown in drawing FIGS. 2 and 3. The adhesive 16 may even be applied to both the lead fingers 10 and the active surface 12 of the good die 14.

In addition, the active surface 12 of the good die may be coated with the adhesive 16 in-line on the die attacher by write dispensing, stamp pad transfer, screen printing, or syringe dispensing. In stamp pad transfer applications, the adhesive is applied to a negative of the desired adhesive pattern. A pad then transfers the desired adhesive pattern to the surface by first contacting the negative and then being stamped on the active surface of the good die. In syringe applications, a positive pressure is applied to a syringe containing the adhesive in order to extrude the adhesive onto the desired surface in the desired predetermined pattern on the good die. In-line application of the adhesive has the advantage of maintaining efficient production rates while minimizing the use of adhesive in a predetermined pattern on a good die.

The adhesive 16 is either a liquid or paste mixture of unreacted monomers or polymers or a diluted resin. The adhesive 16 may be of two kinds of chemical mixtures. First, a curing type contains solvent, monomers or intermediate polymers, and filler. Second, a drying type contains solvent, polymeric resin (pre-cured), and filler. In addition, the adhesive 16 may also be a combination of the two types. The filler is used to increase the thixotropic index and flowability, if desired or required. The filler also decreases the coefficient of thermal expansion (CTE) mismatch among the good die-adhesive-leadframe interfaces. The filler may be of any well-known type such as fused or fumed silica. The solvent and filler determine the rheologic characteristics (form and flow) of the adhesive for various deposition techniques. For example, screen printing requires a higher thixotropy and a medium viscosity. As another example, the spray-on technique uses a medium thixotropy and a lower viscosity. Conventional adhesives suited for this application include polyimide or polyimide siloxane. In addition, snap (or fast) cure epoxies can be used to reduce cycle time.

The adhesive 16 is applied as a wet film in either a liquid or paste, the optimal thickness typically being between 8 microns and 200 microns. Because the good die 14 and leadframe 30 are attached by a wet film and before the adhesive 16 has cured, the leadframe 30 may be removed from the good die 14 subsequently for whatever reason after the attachment of the leadframe 30 thereto. Therefore, under the process of the present invention, if required, rework of good dice becomes easier and less expensive.

If necessary, an intermediate curing step may be used. After the adhesive 16 has been applied to the active surface 12 of the good die 14 or lead fingers 10 of the leadframe 30 and before the leadframe 30 is attached to the good die 14, the adhesive 16 can then be "B staged" or partially cured. A "B-stage" resin is a resin in an intermediate state of flow in a thermosetting reaction and is tacky and capable of further flow.

The next step involves combining the leadframe 30 and the good die 14. The leadframe 30 is attached to the good die 14 using any well-known method, such as applying a force 21 to press the leadframe 30 (see FIG. 3), adhesive 16, and good die 14 together, as shown in drawing FIG. 1.

If necessary, a post curing step may be utilized. The liquid layer of adhesive 16 may be cured or dried using ultraviolet (UV), infrared (IR), or conventional or temperature zone ovens. If a curing type adhesive is used, the monomers or intermediate polymers will react under external energies such as ultraviolet light or heat through chain polymerization and condensation. The chain polymerization reaction is preferred as the condensation reaction is susceptible to moisture attack because of potential voids and byproducts, such as water, formed inside the adhesive. If a drying type adhesive is used, the adhesive must be completely baked to drive out the solvent. If a snap (or fast) cure epoxy is used, a temperature zone oven may be employed.

Depending on application and manufacturing needs, an in-line drying or curing system may be used to improve efficiency and reliability. For example, a five and eight temperature zone oven can increase throughput and help reduce voiding.

For increased efficiency, the process of the present invention may be integrated into a die lamination process. This has the advantage of reducing required floor space, reducing the number of equipment pieces, reducing processing steps, and reducing the logistics control. The result is a reduction in capital expenditure and labor costs as well as increased throughput.

In a further embodiment, the present invention includes the following additional steps:

6. Identifying the good dice, now with attached lead fingers, that fail to meet acceptable performance criteria (bad die).
7. Removing the lead fingers from the active surface of the bad die.
8. Fixing or reworking the die.

After the lead fingers 10 of the leadframe 30 have been attached to the good die 14, the good die 14 may be tested again using any well-known methods to identify dice that do not meet acceptable performance standards (bad die). If the die meets acceptable performance criteria, it is moved on for further processing. If the die does not meet acceptable performance standards as previously determined to be considered an acceptable die, it may be sent for reworking in an attempt to meet such acceptable performance standards. Because the good die 14 was directly attached to the lead fingers 10 of the leadframe 30 with a wet film adhesive 16 or an adhesive 16 that was only partially cured, the leadframe 30 may be removed from the unacceptable semiconductor device 14 for rework. In this manner, valuable process time is not wasted on dice that are bad.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of attaching at least one semiconductor die having an active surface thereon to at least one lead of a plurality of leads of a leadframe, the at least one semiconductor die to be separated from a semiconductor wafer having a plurality of semiconductor dice thereon comprising:

determining criteria for an acceptable semiconductor die of the plurality of semiconductor dice;

testing each semiconductor die of the semiconductor wafer to determine if the criteria for the acceptable semiconductor die are included in any semiconductor die of the plurality of semiconductor dice;

applying an adhesive in a wet film state in a form of one of a liquid and a paste in a predetermined pattern to portions of the active surface of the acceptable semiconductor die;

partially curing the adhesive from the wet film state to an intermediate tacky and flowable state;

removably attaching a portion of the at least one lead of the plurality of leads of the leadframe to a portion of the active surface of the acceptable semiconductor die using the partially cured intermediate tacky and flowable state adhesive;

identifying additional criteria of the acceptable semiconductor die attached to the leadframe;

testing the acceptable semiconductor die attached to the at least one lead of the plurality of leads of the leadframe to determine if the additional criteria are present in the acceptable semiconductor die;

removing the at least one lead of the plurality of leads of the leadframe attached to the acceptable semiconductor die therefrom if the acceptable semiconductor die is determined to be an unacceptable semiconductor die based on the testing; and reworking the unacceptable semiconductor die.

2. The method of claim 1, wherein identifying the additional criteria for the acceptable semiconductor die includes identifying the criteria from one of before the acceptable semiconductor die is separated from the semiconductor wafer and after the acceptable semiconductor die is separated from the semiconductor wafer.

3. The method of claim 1, wherein identifying the additional criteria of the acceptable semiconductor die includes identifying the criteria after the acceptable semiconductor die is separated from the semiconductor wafer.

4. The method of claim 1, further comprising:

applying the adhesive to the acceptable semiconductor die only after the acceptable semiconductor die has been tested.

5. The method of claim 1, further comprising:

curing the adhesive after removably attaching the portion of the at least one lead of the plurality of leads of the leadframe to the acceptable semiconductor die.

6. The method of claim 1, wherein the adhesive is applied to more than one separated semiconductor die at a time.

7. The method of claim 1, wherein applying the adhesive includes:

screen printing the adhesive on the acceptable semiconductor die.

8. The method of claim 1, wherein applying the adhesive includes:

roll-on of the adhesive on the acceptable semiconductor die.

9. The method of claim 1, wherein applying the adhesive includes:

spraying the adhesive on the acceptable semiconductor die.

10. The method of claim 1, wherein applying the adhesive includes:

write dispensing the adhesive on the acceptable semiconductor die.

11. The method of claim 1, wherein applying the adhesive includes:

transferring the adhesive on the acceptable semiconductor die using a stamp pad.

12. The method of claim 1, wherein applying the adhesive includes:

syringe dispensing the adhesive on the acceptable semiconductor die.

13. The method of claim 1, wherein the at least one lead of the plurality of leads of the leadframe is attached to the acceptable semiconductor die before the adhesive is partially cured to the intermediate tacky and flowable state.

14. The method of claim 1, wherein the adhesive forms an adhesive layer that is between 8 microns and 200 microns thick.

15. The method of claim 1, further comprising:

applying the adhesive to the plurality of leads of the leadframe before attaching the at least one lead of the plurality of leads of the leadframe to the acceptable semiconductor die.

16. A method of attaching a semiconductor die having an active surface thereon to at least one lead of a plurality of leads of a leadframe, the semiconductor die provided from a semiconductor wafer having a plurality of semiconductor dice thereon comprising:

identifying criteria for an acceptable semiconductor die of the plurality of semiconductor dice, wherein identifying included one of identifying the criteria before the acceptable semiconductor die is separated from a semiconductor wafer and identifying the criteria for the acceptable semiconductor die and the acceptable semiconductor die is separated from the semiconductor wafer;

testing the plurality of semiconductor dice of the semiconductor wafer to determine if the criteria for the acceptable semiconductor die are included in a semiconductor die of the plurality of semiconductor dice;

applying an adhesive in a wet film state in a form of one of a liquid and a paste in a predetermined pattern to at least a portion of the active surface of more than one acceptable semiconductor die after the more than one acceptable semiconductor die has been identified using the criteria;

partially curing the adhesive from the wet film state to an intermediate tacky and flowable state; and removably attaching portions of the at least one lead of the plurality of leads of the leadframe to the acceptable semiconductor die using the intermediate tacky and flowable state partially cured adhesive.

17. The method of claim 16, further comprising:

curing the adhesive after attaching the at least one lead of the plurality of leads of the leadframe to the acceptable semiconductor die.

18. The method of claim 16, further comprising:

identifying additional criteria for the acceptable semiconductor die attached to the at least one lead of the plurality of leads of the leadframe;

testing the acceptable semiconductor die attached to the at least one lead of the plurality of leads of the leadframe to determine if the additional criteria are present in the acceptable semiconductor die;

removing the at least one lead of the plurality of leads of the leadframe attached to the acceptable semiconductor die from the acceptable semiconductor die if the acceptable semiconductor die is determined to be an unacceptable semiconductor die based on the testing; and reworking the unacceptable semiconductor die.

19. The method of claim 16, wherein the adhesive is applied to more than one separated acceptable semiconductor die at a time.

20. The method of claim 16, wherein applying the adhesive includes:
screen printing the adhesive on the acceptable semiconductor die.

21. The method of claim 16, wherein applying the adhesive includes:
roll-on of the adhesive on the acceptable semiconductor die.

22. The method of claim 16, wherein applying the adhesive includes:
spraying the adhesive on the acceptable semiconductor die.

23. The method of claim 16, wherein applying the adhesive includes:
write dispensing the adhesive on the acceptable semiconductor die.

24. The method of claim 16, wherein applying the adhesive includes:
transferring the adhesive on the acceptable semiconductor die using a stamp pad.

25. The method of claim 16, wherein applying the adhesive includes:
syringe dispensing the adhesive on the acceptable semiconductor die.

26. The method of claim 16, wherein the leadframe is attached to the acceptable semiconductor die before the adhesive is cured to the intermediate tacky and flowable state.

27. The method of claim 16, wherein the adhesive forms an adhesive layer that is between 8 microns and 200 microns thick.

28. The method of claim 16, further comprising:
applying the adhesive to the plurality of leads of the leadframe before attaching the at least one lead of the leadframe to the acceptable semiconductor die.

29. A method of attaching a semiconductor die to a leadframe, the semiconductor die provided from a semiconductor wafer having a plurality of semiconductor dice thereon comprising:
identifying acceptable criteria of a semiconductor die of the plurality of semiconductor dice, identifying including one of identifying the criteria before the semiconductor die is separated from the semiconductor wafer and identifying the criteria for the acceptable semiconductor die after the semiconductor die is separated from a semiconductor wafer;
identifying an acceptable semiconductor die having the acceptable criteria;
applying a wet film adhesive in one of a liquid and a paste to portions of at least two lead fingers of the leadframe in a predetermined pattern;
applying an adhesive in a wet film state in one of a liquid and a paste to portions of an active surface of the acceptable semiconductor die in a predetermined pattern;

curing the adhesive on the at least two lead fingers of the leadframe and the active surface of the acceptable semiconductor die from the wet film state to an intermediate tacky and flowable state; and removably attaching the at least two lead fingers of the leadframe to the acceptable semiconductor die.

30. The method of claim 29, further comprising:
curing the adhesive after attaching the at least two lead fingers of the leadframe to the acceptable semiconductor die.

31. The method of claim 29, further comprising:
identifying additional acceptable criteria of the acceptable semiconductor die attached to the at least two lead fingers of the leadframe;
testing the acceptable semiconductor die attached to the at least two lead fingers of the leadframe to determine if the additional acceptable criteria are present in the acceptable semiconductor die;
removing the at least two lead fingers attached to the acceptable semiconductor die from the acceptable semiconductor die if the acceptable semiconductor die is determined to be an unacceptable semiconductor die based on the testing; and
reworking the unacceptable semiconductor die.

32. The method of claim 29, wherein the adhesive is applied to more than one separated acceptable semiconductor die at a time.

33. The method of claim 29, wherein applying the adhesive to the active surface of the acceptable semiconductor die includes:
screen printing the adhesive on the acceptable semiconductor die.

34. The method of claim 29, wherein applying the adhesive to the active surface of the acceptable semiconductor die includes:
roll-on of the adhesive on the acceptable semiconductor die.

35. The method of claim 29, wherein applying the adhesive to the active surface of the acceptable semiconductor die includes:
spray-on of the adhesive on the acceptable semiconductor die.

36. The method of claim 29, wherein applying the adhesive to the active surface of the acceptable semiconductor die includes:
write dispensing the adhesive on the acceptable semiconductor die.

37. The method of claim 29, wherein applying the adhesive to the active surface of the acceptable semiconductor die includes:
transferring the adhesive on the acceptable semiconductor die using a stamp pad.

38. The method of claim 29, wherein applying the adhesive to the active surface of the acceptable semiconductor die includes:
syringe dispensing the adhesive on the acceptable semiconductor die.

39. The method of claim 29, wherein the adhesive forms an adhesive layer that is between 8 microns and 200 microns thick.

40. The method of claim 29, wherein the adhesive is applied as a powder on a surface of the acceptable semiconductor die which has a wetting agent thereon.

41. A method of attaching at least one semiconductor die having an active surface thereon to at least one lead of a plurality of leads of a leadframe, the at least one semiconductor die to be separated from a semiconductor wafer having a plurality of semiconductor dice thereon comprising:

determining criteria for an acceptable semiconductor die of the plurality of semiconductor dice;

testing each semiconductor die of the semiconductor wafer to determine if the criteria for the acceptable semiconductor die are included in each semiconductor die to identify the acceptable semiconductor die having the criteria;

applying adhesive in a predetermined pattern to the at least one lead of the plurality of leads of the leadframe in a form of one of a liquid and a paste before attaching the at least one lead of the plurality of leads of the leadframe to the acceptable semiconductor die;

partially curing the adhesive from a wet film state to an intermediate tacky and flowable state while in the predetermined pattern on the at least one lead of the plurality of leads of the leadframe;

removably attaching a portion of the at least one lead of the plurality of leads of the leadframe to a portion of the active surface of the acceptable semiconductor die using the partially cured intermediate tacky and flowable state adhesive;

identifying additional criteria of the acceptable semiconductor die attached to the at least one lead of the plurality of leads of the leadframe;

testing the acceptable semiconductor die attached to the at least one lead of the plurality of leads of the leadframe to determine if the additional criteria are present in the acceptable semiconductor die;

removing the at least one lead of the plurality of leads of the leadframe attached to the acceptable semiconductor die therefrom if the acceptable semiconductor die is determined to be an unacceptable semiconductor die based on the testing; and reworking the unacceptable semiconductor die.

42. The method of claim 41, wherein identifying the criteria for the acceptable semiconductor die includes identifying the criteria from one of before the acceptable semiconductor die is separated from a semiconductor wafer and after the acceptable semiconductor die is separated from the semiconductor wafer.

43. The method of claim 41, wherein identifying the criteria of the acceptable semiconductor die includes identifying the criteria after the acceptable semiconductor die is separated from a semiconductor wafer.

44. The method of claim 41, further comprising:

applying adhesive to an acceptable semiconductor die after the acceptable semiconductor die has been tested.

45. The method of claim 41, further comprising:

curing the adhesive after removably attaching the portion of the at least one lead of the plurality of leads of the leadframe to the acceptable semiconductor die.

46. The method of claim 41, wherein the adhesive is applied to more than one separated semiconductor die at a time.

47. The method of claim 41, wherein the adhesive forms an adhesive layer that is between 8 microns and 200 microns thick.

48. A method of attaching a semiconductor die having an active surface thereon to at least one lead of a leadframe having a plurality of leads, the semiconductor die provided from a semiconductor wafer having a plurality of semiconductor dice thereon comprising:

identifying criteria for an acceptable semiconductor die of the plurality of semiconductor dice, identifying including one of identifying the criteria before the semiconductor die is separated from a semiconductor wafer and identifying the criteria after the semiconductor die is separated from a semiconductor wafer;

testing the plurality of semiconductor dice of the semiconductor wafer to determine if the criteria for the acceptable semiconductor die are included in a semiconductor die of the plurality of semiconductor dice;

applying an adhesive in a predetermined pattern in a wet film state in a form of one of a liquid and a paste in a predetermined pattern to the at least one lead of the plurality of leads of the leadframe and the active surface of the acceptable semiconductor die after an acceptable semiconductor die has been identified using the criteria;

partially curing the adhesive from the wet film state to an intermediate tacky and flowable state; and removably attaching portions of the at least one lead of the plurality of leads of the leadframe to the acceptable semiconductor die using the intermediate tacky and flowable state partially cured adhesive.

49. The method of claim 48, further comprising:

curing the adhesive after attaching the at least one lead of the plurality of leads of the leadframe to the acceptable semiconductor die.

50. The method of claim 48, further comprising:

identifying additional criteria for the acceptable semiconductor die attached to the at least one lead of the plurality of leads of the leadframe;

testing the acceptable semiconductor die attached to the at least one lead of the plurality of leads of the leadframe to determine if the additional criteria are present in the acceptable semiconductor die;

removing the at least one lead of the plurality of leads of the leadframe attached to the acceptable semiconductor die from the acceptable semiconductor die if the acceptable semiconductor die is determined to be an unacceptable semiconductor die based on the testing; and reworking the unacceptable semiconductor die.

51. The method of claim 48, wherein the adhesive is applied to more than one separated acceptable semiconductor die at a time.

52. The method of claim 48, wherein the leadframe is attached to the acceptable semiconductor die before the adhesive is cured to the intermediate tacky and flowable state.

53. The method of claim 48, wherein the adhesive forms an adhesive layer that is between 8 microns and 200 microns thick.

54. A method of attaching a semiconductor die to a leadframe, the semiconductor die provided from a semiconductor wafer having a plurality of semiconductor dice thereon, each semiconductor die of the plurality of semiconductor dice having an active surface, comprising:

using acceptable criteria of a semiconductor die of the plurality of semiconductor dice, identifying including one of identifying the criteria before the semiconductor die is separated from a semiconductor wafer and identifying the criteria after the semiconductor die is separated from a semiconductor wafer for identifying an acceptable semiconductor die having the acceptable criteria;

applying a wet film adhesive in one of a liquid and a paste to portions of at least two lead fingers of the leadframe;

applying an adhesive in a predetermined pattern in a wet film state in one of a liquid and a paste to portions of the active surface of the acceptable semiconductor die in a predetermined pattern;

curing the adhesive on the at least two lead fingers of the leadframe and the acceptable semiconductor die active surface from the wet film state to an intermediate tacky and flowable state; and removably attaching the at least two lead fingers of the leadframe to the acceptable semiconductor die.

55. The method of claim 54, further comprising:

curing the adhesive after attaching the at least two lead fingers of the leadframe to the acceptable semiconductor die.

56. The method of claim 54, further comprising:

using additional acceptable criteria of the acceptable semiconductor die attached to the at least two lead fingers of the leadframe;

testing the acceptable semiconductor die attached to the at least two lead fingers of the leadframe to determine if the additional acceptable criteria are present in the acceptable semiconductor die;

removing the at least two lead fingers attached to the acceptable semiconductor die from the acceptable semiconductor die if the acceptable semiconductor die is determined to be an unacceptable semiconductor die based on the testing; and reworking the unacceptable semiconductor die.

57. The method of claim 54, wherein the adhesive is applied to more than one separated acceptable semiconductor die at a time.

58. The method of claim 54, wherein applying the adhesive to the active surface of the acceptable semiconductor die includes:

screen printing the adhesive on the acceptable semiconductor die.

59. The method of claim 54, wherein applying the adhesive to the active surface of the acceptable semiconductor die includes:

roll-on of the adhesive on the acceptable semiconductor die.

60. The method of claim 54, wherein applying the adhesive to the active surface of the acceptable semiconductor die includes:

spray-on of the adhesive on the acceptable semiconductor die.

61. The method of claim 54, wherein applying the adhesive to the active surface of the acceptable semiconductor die includes:

write dispensing the adhesive on the acceptable semiconductor die.

62. The method of claim 54, wherein applying the adhesive to the active surface of the acceptable semiconductor die includes:

transferring the adhesive on the acceptable semiconductor die using a stamp pad.

63. The method of claim 54, wherein applying the adhesive to the active surface of the acceptable semiconductor die includes:

syringe dispensing the adhesive on the acceptable semiconductor die.

64. The method of claim 54, wherein the adhesive forms an adhesive layer that is between 8 microns and 200 microns thick.

65. The method of claim 54, wherein the adhesive is applied as a powder on a surface of the acceptable semiconductor die which has a wetting agent thereon.

66. A semiconductor die attachment method for removably attaching a semiconductor die having an active surface thereon to a portion of a leadframe comprising:

applying an adhesive in a wet film state in a form of one of a liquid and a paste in a predetermined pattern to portions of the active surface of the acceptable semiconductor die;

partially curing the adhesive from the wet film state to an intermediate tacky and flowable state;

removably attaching a portion of the leadframe to a portion of the active surface of the semiconductor die using the partially cured intermediate tacky and flowable state adhesive; and testing the semiconductor die attached to the portion of the leadframe for removing the portion of the leadframe attached to the semiconductor die therefrom when the semiconductor die is defective.

67. A method of attaching a semiconductor die to a portion of a leadframe comprising:

applying a wet film adhesive in one of a liquid and a paste to the portion of the leadframe in a predetermined pattern;

applying an adhesive in a wet film state in one of a liquid and a paste to portions of an active surface of the semiconductor die in a predetermined pattern;

curing the adhesive on the portion of the leadframe and the active surface of the semiconductor die from the wet film state to an intermediate tacky and flowable state; and removably attaching at least two lead fingers of the leadframe to the semiconductor die.

68. A method of attaching a semiconductor die having an active surface thereon to a portion of a leadframe comprising:

applying adhesive in a predetermined pattern to a portion of the leadframe in a form of one of a liquid and a paste before attaching at least one lead of the leadframe to an acceptable semiconductor die;

partially curing the adhesive from a wet film state to an intermediate tacky and flowable state while in the predetermined pattern on the at least one lead of the leadframe;

removably attaching the portion of the leadframe to a portion of the active surface of the acceptable semiconductor die using the partially cured intermediate tacky and flowable state adhesive;

testing the acceptable semiconductor die attached to the at least one lead of the leadframe using identifying criteria of an acceptable semiconductor die to determine if the additional criteria are present in the acceptable semiconductor die;

removing the portion of the leadframe attached to the acceptable semiconductor die therefrom if the acceptable semiconductor die is determined to be an unacceptable semiconductor die based on the testing; and reworking the unacceptable semiconductor die.

\* \* \* \* \*

UNITED STATES PATENT AND TRADEMARK OFFICE
CERTIFICATE OF CORRECTION

PATENT NO. : 6,979,598 B2 Page 1 of 1
APPLICATION NO. : 10/799948
DATED : December 27, 2005
INVENTOR(S) : Jiang Tongbi, Syed S. Ahmed and Walter L. Moden It is certified that error appears in the above-identified patent and that said Letters Patent is hereby corrected as shown below:

On the title page: Item (74)
*Attorney, Agent, or Firm:* change "TrazkBritt" to --TraskBritt--

CLAIM 66, COLUMN 14, LINE 9, after the second occurrence of "the" delete "acceptable"

Signed and Sealed this

Sixth Day of November, 2007

JON W. DUDAS
*Director of the United States Patent and Trademark Office*